United States Patent [19]
Sukharev

[11] Patent Number: 6,030,460
[45] Date of Patent: Feb. 29, 2000

[54] METHOD AND APPARATUS FOR FORMING DIELECTRIC FILMS

[75] Inventor: Valeriy K. Sukharev, Cupertino, Calif.

[73] Assignee: LSI Logic Corporation, Milpitas, Calif.

[21] Appl. No.: 08/926,220

[22] Filed: Sep. 9, 1997

Related U.S. Application Data

[62] Division of application No. 08/653,264, May 24, 1996, Pat. No. 5,710,079.

[51] Int. Cl.[7] .................................................. C23C 16/00
[52] U.S. Cl. ............................ 118/722; 118/725; 118/726
[58] Field of Search .................................. 118/722, 725, 118/726

[56] References Cited

U.S. PATENT DOCUMENTS

| | | | |
|---|---|---|---|
| 4,639,288 | 1/1987 | Price et al. | 156/643 |
| 4,916,091 | 4/1990 | Freeman | 437/238 |
| 5,017,404 | 5/1991 | Paquet | 427/573 |
| 5,231,058 | 7/1993 | Maeda et al. | 437/235 |
| 5,286,681 | 2/1994 | Maeda et al. | 437/240 |
| 5,312,781 | 5/1994 | Gregor et al. | 437/235 |
| 5,387,546 | 2/1995 | Maeda et al. | 437/174 |
| 5,593,741 | 1/1997 | Ikeda | 427/579 |

FOREIGN PATENT DOCUMENTS

| | | |
|---|---|---|
| 2-188622 | 7/1990 | Japan . |
| 3-190229 | 8/1991 | Japan . |
| 2-50966 | 2/1992 | Japan . |

OTHER PUBLICATIONS

John E. Crowell, Laura L. Tedder, Hee–Chuen Cho, and Frank M. Cascarano, "Model Studies of Dielectric Thin Film Growth: Chemical Vapor Deposition of $SiO_2$ ", J. Vac. Science Technology A8(3), May/Jun. 1990, © 1990 American Vacuum Society.

Nur Selamoglu, John A. Mucha, Dale E. Ibbotson, and Daniel L. Flamm, "Silicon Oxide Deposition from Tetraethoxysilane in a Radio Frequency Downstream Reactor: Mechanisms and Step Coverage," J. Vac. Science Technology B7(6), Nov./Dec. 1989, © 1989 American Vacuum Society.

Phillip J. Stout and Mark J. Kushner, "Monte Carlo Simulation of SurfaKinetics During Plasma Enhanced Chemical Vapor Deposition of $SiO_2$ Using Oxygen/Tetraethoxysilane Chemistry," J. Vac. Science Technology A, vol. 11, No. 5, Sep./Oct. 1993.

Sorab K. Ghandi, "VLSI Fabrication Principles: Silicon and Gallium Arsenide", Rev. Ed. [2nd ed.], John Wiley & Sons, Inc., © 1994, Library of Congress Cataloging–in–Publication Data.

David J. Elliott, "Integrated Circuits—Design and Construction", © 1989, Library of Congress Cataloging–in–Publication Data.

S.M. Sze, *Semiconductor Devices, Physics and Technology*, 1936, Library of Congress Cataloging–in–Publication Data, © 1985 by Bell Telephone Laboratories, Inc.

(List continued on next page.)

*Primary Examiner*—Richard Bueker

[57] ABSTRACT

Disclosed is a method and apparatus for facilitating the decomposition of organometallic compounds such as TEOS in chemical vapor deposition reactors in order to form deposition films. The method generally includes: (1) introducing an organometallic compound and ozone molecules to a chemical vapor deposition reactor; (2) directing ultraviolet radiation into the chemical vapor deposition reactor to increase the rate at which oxygen atoms are formed from the ozone molecules present in the chemical vapor deposition reactor; and (3) decomposing the organometallic compound to form a deposition layer. The organometallic compound decomposes at an accelerated rate due in part to an increased amount of hydroxyl radicals present in the chemical vapor deposition reactor.

16 Claims, 4 Drawing Sheets

OTHER PUBLICATIONS

Gregory B. Raupp, Timothy S. Cale, and H. Peter W. Hey, "The Role of Oxygen Excitation and Loss an Plasma–Enhanced Deposition of Silicon Dioxide from Tetraethylorthosilicate,", J. Vac. Science Technology, B10(1), Jan./Feb. 1992, © 1992 American Vacuum Society.

Vik J. Kapoor and William D. Brown, "Silicon Nitride and Silicon Dioxide Thin Insulating Films,"Dielectric Science and Technology and Electronics Divisions, vol. 94–16.

Akira Kubo, Kazuyuki Hirose, Tetsuya Homma, and Yukinobu Murao, "An Interlayer Dielectric Films Formation Technology Using TEOS/$0_3$ APCVD $SiO_2$ Films on Dual Frequency TEOS/$0_2$ PECVD $SiO_2$ Films," NEC Corp., Kanagawa 229, Japan, Jun. 7–8, 1994, VMIC Conference, 1994 ISMIC–103/94/0094.

Daniel M. Dobkin, Simin Mokhtari, Melvin Schmidt, Anil Pant, Linda Robinson, and Art Sherman, "Mechanisms of Deposition of $SiO_2$ from TEOS and Related Organosilicon Compounds and Ozone," J. Electrochem Soc., vol. 142, No. 7, Jul. 1995 © The Electrochemical Society, Inc.

Craig D. Adams, Patricia A. Scanlan, and Neal D. Secrist, "Oxidation and Biodegradability Enhancement of 1,4–Dioxane Using Hydrogen Peroxide and Ozone,"Environ. Sci. Technol., vol. 28, No. 11, 1994, © 1994 American Chemical Society.

METHOD AND APPARATUS FOR FORMING DIELECTRIC FILMS

This is a Divisional application of prior application Ser. No. 08/653,264 filed on May 24, 1996, now U.S. Pat. No. 5,710,079.

BACKGROUND OF THE INVENTION

The present invention relates generally to methods and apparatuses for depositing films on partially fabricated integrated circuits (ICs). More specifically, the invention relates to methods and apparatuses for accelerating the deposition of certain materials from organometallic compounds.

In integrated circuit fabrication, various materials are deposited on a substrate at various stages in the fabrication process. By way of example, dielectric layers may be formed between metallization layers to enable the formation of multi-level connections to devices, to produce field oxide regions used to isolate semiconductor active devices, to produce passivation layers used to protect entire IC chips during packaging, and to form masks used in subsequent etching processes.

There are many well known techniques used for depositing dielectric materials such as silicon dioxide ($SiO_2$). Such techniques often include the use of an organometallic reactant such as tetraethylorthosilicate "TEOS" $Si(OC_2H_5)_4$. Such materials are introduced into a chemical vapor deposition (CVD) reactor chamber and there decomposed to form $SiO_2$ films and by-products. TEOS is in a liquid state at room temperatures and must be heated in an external vaporizing apparatus or otherwise converted to the gas phase before being introduced into a CVD reactor chamber.

Although forming $SiO_2$ films from TEOS is popular because generally good step coverage is provided and the required deposition temperatures are relatively low, TEOS is very expensive. Therefore, there is a need to utilize a high percentage of TEOS in producing $SiO_2$ films (as opposed to being pumped out of the CVD reaction chamber as unused reactant).

At least three TEOS-based $SiO_2$ deposition processes are now commonly used. These include plasma enhanced chemical vapor deposition—with oxygen ($PECVD-O_2$), low pressure chemical vapor deposition—with oxygen (thermal $LPCVD-O_2$), and atmospheric pressure chemical vapor deposition—with ozone ($APCVD-O_3$). While the introduction of oxygen and ozone promotes TEOS decomposition, it has been found that the TEOS decomposition reaction is still quite slow and therefore causes significant problems. Notably, a relatively high fraction of the TEOS introduced into a CVD chamber goes unreacted and is therefore wasted. In addition, the relatively slow rate at which TEOS decomposes has been found to cause certain structural defects (e.g., voids) resulting from the deposition of TEOS $SiO_2$ films over gaps between vertical structures.

Figure 1:
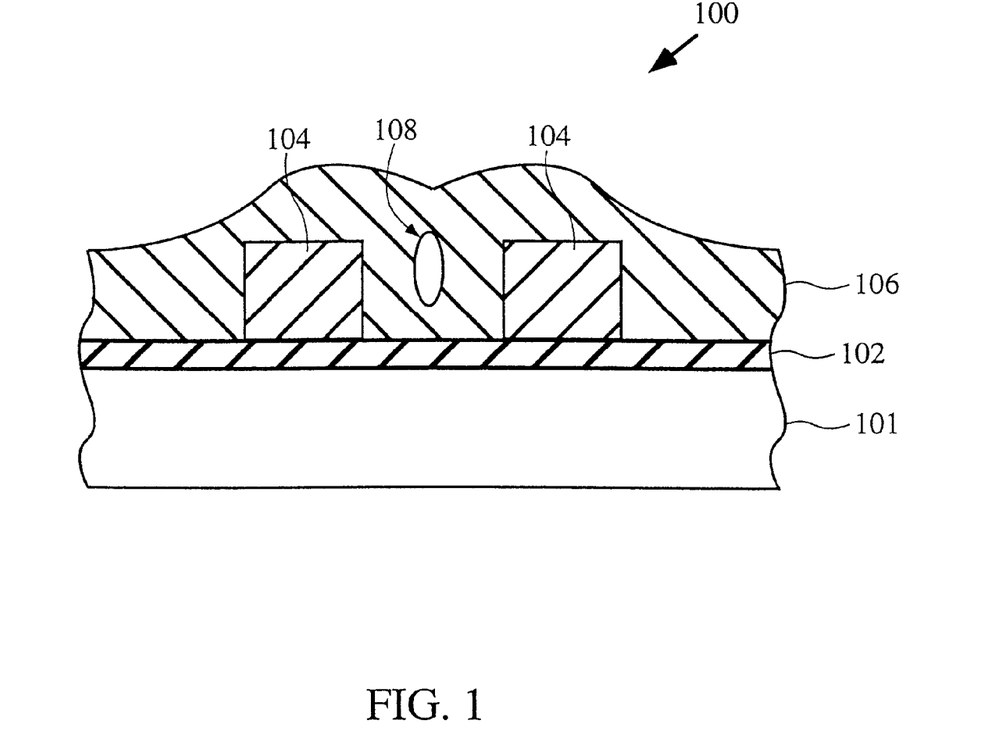
FIG. 1 is diagrammatic illustration of a void formed in a gap between raised surface regions using conventional TEOS silicon dioxide film deposition.

By way of example, FIG. 1 is a cross-sectional view of a partially fabricated semiconductor device 100. A silicon substrate 101 is shown having a thin dielectric layer 102 deposited over silicon substrate 101. Any conventional method may be used to deposit dielectric layer 102. A metallization layer is then blanket deposited over dielectric layer 102 such that the entire surface is covered with metallization material. The metallization material is then patterned using conventional photolithography processes to define metallization lines 104 over dielectric layer 102. Next, a silicon dioxide film 106 is deposited by reaction of TEOS and $O_2$ and/or $O_3$ over metallization lines 104 and dielectric layer 102. As illustrated, a void 108 may form between the gap between metallization lines 104.

The formation voids 108 in between gaps may present various undesirable consequences. By way of example, when successive layers are formed over silicon dioxide film 106, the danger of structural support or micro-cracking may cause entire integrated circuit (IC) chips to become unusable.

It should also be noted that slow TEOS decomposition rates may also reduce IC throughput since wafers must sit in deposition chamber reactors for longer periods of time. Still further, slow TEOS decomposition may be associated with incomplete removal of carbon containing moieties which remain as contaminants in the deposited silicon dioxide films.

In view of the foregoing, it would be desirable to have a method and apparatus for depositing silicon dioxide films from TEOS by a reaction having increased TEOS decomposition rates to prevent the formation of voids in gaps, to increase the percentage of TEOS actually used to form silicon dioxide and to reduce carbon contamination of silicon dioxide films.

SUMMARY OF THE INVENTION

To achieve the foregoing, the present invention provides a method and apparatus for facilitating the decomposition of organometallic compounds in chemical vapor deposition reactors in order to deposit films. In one embodiment, the method generally includes: (1) introducing an organometallic compound (e.g., TEOS) and ozone molecules to a chemical vapor deposition reactor, (2) directing ultraviolet radiation into the chemical vapor deposition reactor to increase the rate at which oxygen atoms are formed from the ozone molecules present in the chemical vapor deposition reactor; and (3) decomposing the organometallic compound to form a deposition layer (e.g., a silicon dioxide layer). The organometallic compound decomposes at an accelerated rate due in part to an increased concentration of hydroxyl radicals present in the chemical vapor deposition reactor. The hydroxyl radicals are produced from a reaction of oxygen atoms with moisture. In a preferred embodiment, the water vapor and/or hydrogen peroxide is introduced to the chemical vapor deposition reactor to ensure that a high concentration of hydroxyl radicals are present.

In yet another embodiment, an apparatus for depositing a dielectric layer on a substrate is disclosed. The apparatus is preferably suited for decomposing organometallic compounds such as TEOS with the aid of hydroxyl radicals and generally includes: (1) a chemical vapor deposition reactor having a support for a substrate, and at least one inlet port for receiving gases; (2) a source of ozone gas coupled to the at least one inlet port; (3) a source of the organometallic compound coupled to the at least one inlet port; and (4) a source of ultraviolet radiation oriented to direct ultraviolet radiation into the chemical vapor deposition reactor. Such chemical vapor deposition reactors are especially adapted to provide an increased concentration of hydroxyl radicals in accordance with this invention.

These and other features and advantages of the invention will be described in more detail below with reference to the drawings.

DETAILED DESCRIPTION OF THE PREFERRED EMBODIMENTS

The present invention is directed to a method and apparatus for increasing the deposition rate of materials on the surfaces of partially fabricated semiconductor devices. The deposited layers are formed from the decomposition of a suitable organometallic compound in a chemical vapor deposition (CVD) reactor. Generally, the deposited materials may be any material that can be produced from decomposition of an organometallic with the aid ozone. Such materials include dielectrics, semiconductors, and metals used in fabricating ICs and other semiconductor devices. Throughout much of the remainder of this document, silicon dioxide ($SiO_2$) will be used as an example of the deposited material and tetraethylorthosilicate "TEOS" $Si(OC_2H_5)_4$ will be used as an example of the organometallic compound precursor to silicon dioxide.

In accordance with this invention, the organometallic precursor is provided together with ozone to a chemical vapor deposition reactor. The reactor interior is exposed substantially simultaneously to ultra-violet radiation to increase the rate at which ozone decomposes to molecular oxygen and oxygen atoms. The oxygen atoms react with moisture present in the reactor to produce hydroxyl radicals. The hydroxyl radicals then react with the organometallic precursor to accelerate the precursor's decomposition, thereby accelerating the deposition rate. In addition, the presence of hydroxyl radicals reduces the carbon contamination of growing $SiO_2$ films.

Generally, to the extent that the concentration of hydroxyl radicals is increased within the reactor, the deposition rate increases. Thus, the invention generally extends to alternative methods of increasing the concentration of hydroxyl radicals within the reactor. One way of accomplishing this is by providing hydrogen peroxide to the chemical vapor deposition reactor. Preferably, hydrogen peroxide will be provided along with ozone and moisture to a reactor exposed to ultra-violet radiation. Other suitable techniques for increasing hydroxyl radical concentration will be apparent to those of skill in the art.

Turning now to a preferred embodiment of the invention, deposition of silicon dioxide from IEOS is accomplished as follows. Preferably, the deposited silicon dioxide will be employed to separate metallization layers, or to provide poly gap isolation, or to provide passivation on a top metallization layer. The reactor is simultaneously supplied with gaseous TEOS with the aid of an inert nitrogen ($N_2$) carrier gas, an oxygen/ozone ($O_2/O_3$) mixture and water vapor and possible hydrogen peroxide ($H_2O/H_2O_2$) with the aid of an $N_2$ carrier gas. In this embodiment, the reactor is designed to have ultra-violet radiation provided in its interior. In one embodiment, the reactor is equipped with a suitable transmission window for receiving ultraviolet rays from an external source. Preferably, the deposition process is carried out at atmospheric pressure in a chemical vapor deposition process (sometimes referred to as APCVD).

In performing the above described process, the deposition rate of the silicon dioxide film increases due to the accelerated rate at which TEOS is decomposed. As suggested above, the increased rate at which TEOS decomposes is generally correlated to the increased generation of hydroxyl radicals (*OH). As will be described in greater detail below, when ozone ($O_3$) is exposed to ultraviolet radiation, the rate at which ozone decomposes to form oxygen ($O_2$) molecules and atomic oxygen (i.e., oxygen radicals "O*") is increased. Because atomic oxygen rapidly reacts with gaseous water present in the reactor to produce hydroxyl radicals, an increased concentration of hydroxyl radicals can be produced. This beneficially increases the rate at which TEOS decomposes and thereby increases the rate at which silicon dioxide films are formed.

By increasing the rate at which TEOS decomposes, a larger percentage of TEOS will actually be consumed and converted into silicon dioxide films as opposed to being pumped out of the reactor unused. In addition, semiconductor surfaces having gap regions will be less susceptible to void formation as was described with reference to FIG. 1. And, a reduction in carbon contamination will occur due to the increased amount of hydroxyl radicals. It should be appreciated that less carbon contamination will beneficially generate dielectric layers with improved reliability.

Figure 2:
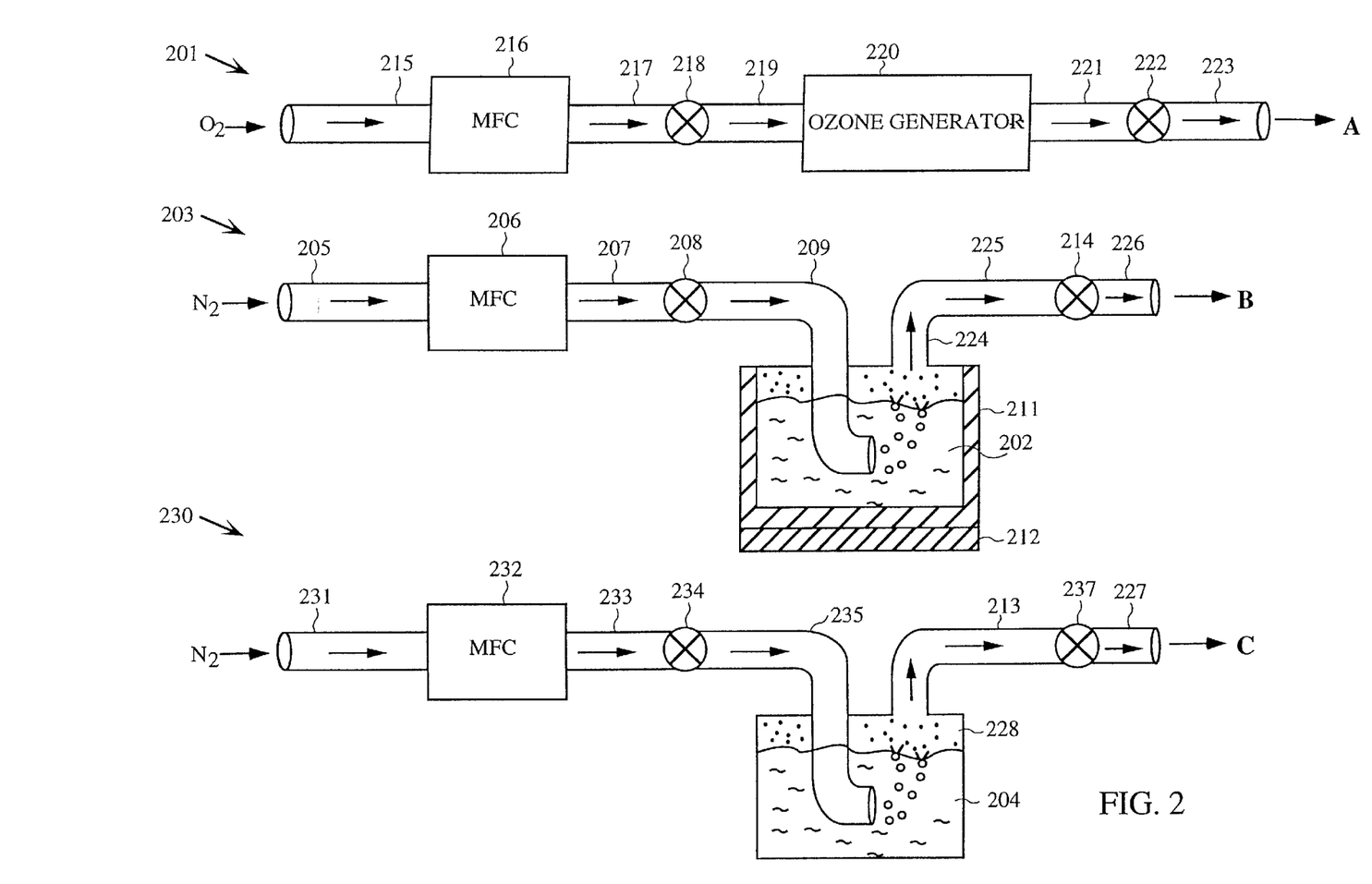
FIG. 2 is a gas conduit network implemented to feed various gaseous reactants into a reaction chamber for depositing dielectric films in accordance with a preferred embodiment of this invention.

FIG. 2 illustrates a gaseous reactant generation and transport network 200 implemented to feed various gaseous reactants into a CVD reaction chamber for depositing silicon dioxide films. In the embodiment illustrated, a first conduit network 201 is provided to generate an oxygen/ozone ($O_2/O_3$) mixture which is directed into a CVD reaction chamber. In this embodiment, oxygen gas is fed into a conduit segment 215 which is coupled to a mass flow controller 216 to moderate the flow rate of the oxygen gas being fed into conduit segment 215.

The oxygen gas may then flow into conduit segment 217 which leads to a valve 218 used to control the conduction and suspension of the gaseous oxygen flow. Once gas conduction is facilitated through valve 218, the oxygen gas flows into conduit segment 219 before being fed into an ozone generator 220 which is used to convert oxygen into an oxygen/ozone mixture. Once the appropriate amount of ozone is generated by ozone generator 220, the gaseous mixture is fed into a conduit segment 221 which leads to a valve 222 which is also configured to control the conduction or suspension of the oxygen/ozone gaseous mixture. When conduction is provided by valve 222, the gaseous mixture enters a conduit segment 223 which leads to an outlet A that may be coupled to a reaction chamber that will be described with reference to FIG. 3.

Still referring to FIG. 2, a second conduit network 203 is provided to channel a gaseous nitrogen, and TEOS mixture into a CVD reaction chamber. In this embodiment, an inert nitrogen ($N_2$) carrier gas (or any other suitable inert carrier gas such as argon and helium) is fed into second conduit network 203 at a conduit segment 205 which leads to a mass flow controller 206. Mass flow controller 206 moderates the flow rate of the nitrogen gas to a conduit segment 207 which leads to a valve 208.

Once nitrogen gas is allowed to conduct through valve 208, the nitrogen gas flows through a conduit segment 209 leading to a thermally insulated reservoir 211 containing a liquid TEOS material 202. Thermally insulated reservoir 211 also includes a heating unit 212 configured to deliver sufficient heat to liquid TEOS material 202. Preferably, heating unit 212 may heat liquid TEOS material 202 to a temperature sufficient to vaporize significant quantities of TEOS. By way of example, such temperatures may be between about 20° C. and 100° C. In this manner, liquid TEOS material 202 may be discharged in a gaseous form. As illustrated, the nitrogen gas will preferably discharge below the surface of liquid TEOS 202 (e.g., inside reservoir 211) and bubble through liquid TEOS 202 to generate a gaseous mixture including TEOS and nitrogen. The gaseous mixture then flows out of reservoir 211 and into a conduit segment 225 which leads to a valve 214. When conduction is provided by valve 214, the gaseous mixture may then enter a conduit segment 226 which leads to an outlet B leading to a reaction chamber that will be described with reference to FIG. 3 below.

Still referring to FIG. 2, a third conduit network 230 is provided to deliver a gaseous nitrogen, water and hydrogen peroxide mixture which may be channeled into a CVD reaction chamber. In this embodiment, an inert nitrogen ($N_2$) carrier gas (or any other suitable inert carrier gasses such as argon or helium) is fed into third conduit network 230 at a conduit segment 231 which leads to a mass flow controller 232. Mass flow controller 232 moderates the flow rate of the nitrogen gas to conduit segment 233 which leads to a valve 234. Once nitrogen gas is allowed to conduct through valve 234, the nitrogen gas flows through a conduit segment 235 leading to a fluid reservoir 228 having a liquid mixture 204. In the embodiment shown, liquid mixture 204 is preferably a water and hydrogen peroxide mixture. By way of example, the concentration of liquid mixture 204 is between about 25–70 made percent with the balance being water. More preferably, the concentration is about 50 mole percent hydrogen peroxide and the balance water (i.e., the molar ratio of water to hydrogen peroxide is approximately 1).

As illustrated, the nitrogen gas will then conduct through conduit segment 235 such that the nitrogen gas discharges inside vessel 228 below the surface of liquid mixture 204 and bubbles through that mixture to generate a gaseous mixture including water, hydrogen peroxide and nitrogen. The gaseous mixture flows out of fluid reservoir 228 and into a conduit segment 213 which leads to a valve 237. When conduction is provided by valve 237, the gaseous mixture may then enter a conduit segment 227 which leads to an outlet C on a reaction chamber that will also be described with reference to FIG. 3 below.

Figure 3:
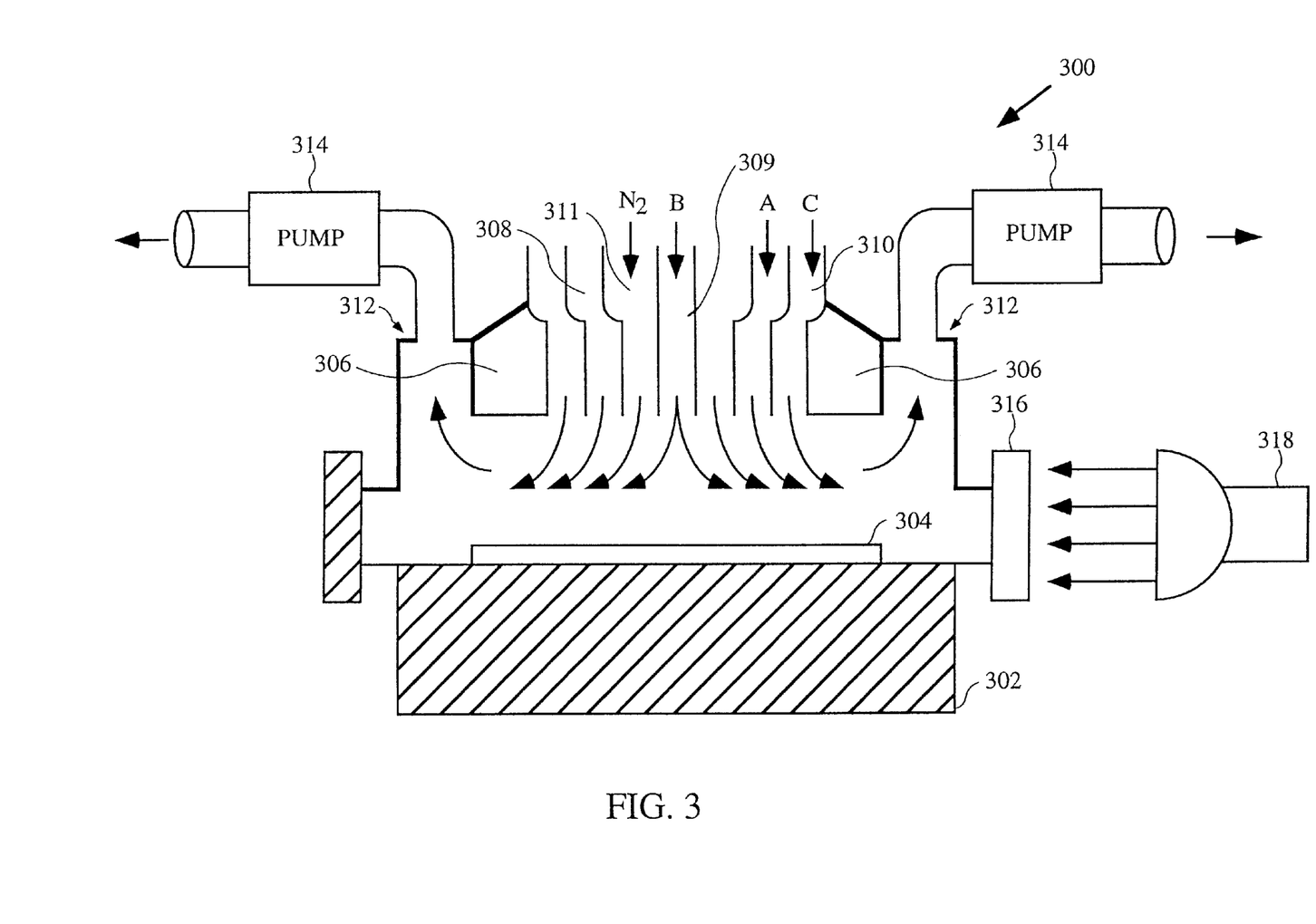
FIG. 3 is a diagrammatic illustration of an atmospheric pressure chemical vapor deposition (APCVD) reaction chamber implemented in accordance with a preferred embodiment of this invention.

FIG. 3 is a diagrammatic illustration of an atmospheric pressure chemical vapor deposition (APCVD) reaction chamber 300 in accordance with one embodiment of the present invention. As shown, a wafer 304 (or other substrate) is placed in reaction chamber 300 such that wafer 304 is secured onto a wafer support chuck 302. Wafer support chuck 302 preferably is provided with a mechanism for moving the wafer so as to ensure uniform deposition thickness along the wafer surface. Reaction chamber 300 is provided with four inlet conduit segments 308, 309, 310 and 311 which are configured to receive gasses output from outlets A, B, C respectively (i.e., of FIG. 2) and in addition, a nitrogen inlet.

In one embodiment, the aforementioned gaseous streams are separately introduced into the reactor chamber 300. TEOS vapor, mixed with nitrogen carrier gas, is separated from $O_3/O_2$ and $H_2O/H_2O_2$ mixtures by another $N_2$ flow. The diffusive mixing of ozone, hydrogen peroxide, water and TEOS occurs after injector 306 provides these reactants to reactor chamber 300.

Reaction chamber 300 is further shown having vents 312 leading to pumps 314 which are configured to extract gaseous by-products not utilized to form a silicon dioxide film over wafer 304. In one embodiment, the by-products extracted from reaction chamber 300 may include a mixture of $2H_2O+4C_2H_4$ (e.g., TEOS decomposition by-products), $N_2$, $O_3$, $O_2$, $H_2O$ and $H_2O_2$. It should be appreciated that vents 312 may have any geometrical shape. By way of example, vents 312 may be cylindrical and surround reaction chamber 300, and pumps 314 may actually be a single vacuum pump unit. Of course, the exact vent and pump configuration will typically depend upon the particular processing environment and wafer size Further, a radiation transmission window 316 is shown coupled to reaction chamber 300 such that a suitable radiation source may transmit radiation into reaction chamber 300 in order to enhance the decomposition rate of the injected ozone molecules. By way of example, radiation transmission window 316 may be a quartz window suitable to transmit ultraviolet radiation into reaction chamber 300. In one embodiment, radiation may be introduced directly from a mercury arc lamp 318 at radiation transmission window 316. It should be appreciated that any suitable radiation source or configuration may be substituted for mercury arc lamp 318. By way of example, a radiation source may have a wavelength radiation spectrum containing 254 nm line corresponding to strong ozone absorption.

Wafer support chuck 302 may be heated to bring the temperature of substrate 304 to between about 20° C. and 500° C., and more preferably between about 200° C. and 500° C., and most preferably about 400° C.

In operation, once reaction chamber has been heated, the gaseous mixtures described in FIG. 2 are channeled through inlet conduit segments 308, 309, 310 and 311. Once the gaseous mixture is in injector 306, the gaseous mixture is preferably evenly pumped into reaction chamber 300 as illustrated by flow lines 320. At this stage, mercury arc lamp 318 is activated such that ultraviolet radiation having an approximate wavelength of 254 (nm) is directed at the gaseous mixture injected into reaction chamber 300.

In this manner, in the water rich gas phase, ozone molecules are caused to decompose and form oxygen molecules and atomic oxygen ($O^*$) in $^1D$ state. As described above, since atomic oxygen is highly reactive with water molecules, a high percentage of hydroxyl radicals will be generated. By way of example, Table A below illustrates the important chemical mechanisms involved in one embodiment of the present invention.

TABLE A

| $O_3$ ---UV--> $O_2 + O^*$ |
|---|
| $O^* + H_2O$ --------> $2OH$ |

As can be seen, water is necessary to produce hydroxyl radicals from oxygen atoms. Water may be provided to the CVD reactor in various ways. In one embodiment, the water is introduced with the $H_2O_2$ or without as shown in FIG. 2. However, because water is a reaction product of TEOS decomposition, it necessarily will be present in the reactor after the TEOS decomposition reaction is initiated. Thus, it may be possible to realize the benefits of this invention without resort to humidifying the TEOS reactant upstream from the reactor.

Although ozone ($O_3$) itself (or least the oxygen radicals generated from ozone) has been found to be a strong activator in decomposing organometallic materials such as TEOS, hydroxyl radicals are believed to be superior in at least two important ways. First, hydroxyl radicals have been found to react with some organic compounds up to nine orders of magnitude faster than ozone. Second, hydroxyl (*OH) radicals are non-selective and react with most intermediate species generated during decomposition of organometallics. On the other hand, ozone only reacts with a few of these species. Therefore, hydroxyl radicals are generally more likely to speed up the rate of decomposition since they indiscriminately react with intermediate species generated at substantially all substeps, while ozone reacts only with species from a few substeps. As a result, TEOS will decompose faster and a larger percentage of TEOS material will actually be used to form a silicon dioxide film over wafer 304.

To place the above properties of hydroxyl radicals in context, note that many researchers believe that TEOS decomposition is a rate limiting step in silicon dioxide deposition. It is further believed that the TEOS decomposition mechanism involves at least (1) stripping of carbon and hydrogen from TEOS as it diffuses on the SiO2 surface; and (2) diffusion until of denuded Si—O group until fixed by formation of an Si—O—Si bond at a reactive site (an —OH site for example). The first of these steps likely takes place in multiple substeps, each with its own organic intermediate product. The hydroxyl radicals generated in accordance with this invention react strongly with each of these intermediate products, while ozone (oxygen radicals) react strongly with only some of these. Thus, while it is not completely clear which of the organic intermediates might be involved in a rate limiting step, the hydroxyl radical is likely to accelerate reaction of those species.

Figure 4:
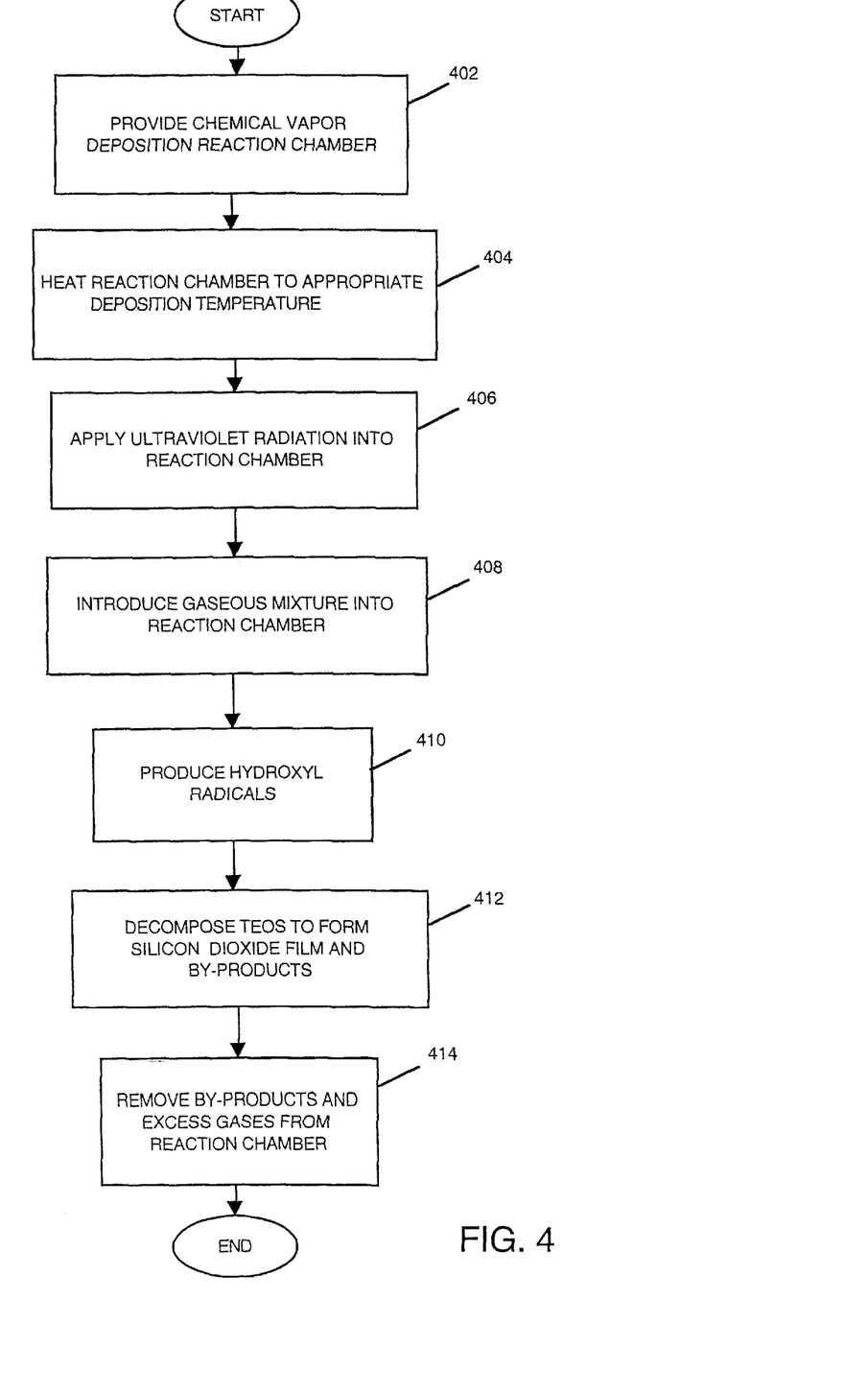
FIG. 4 is a flowchart illustrating the method steps associated with forming silicon dioxide films by decomposing TEOS in accordance with a preferred embodiment of this invention.

The above-described embodiments may be further understood with reference to a flowchart presented in FIG. 4. The flowchart of FIG. 4 illustrates the method steps associated with forming silicon dioxide films by decomposing TEOS in accordance with one embodiment of the present invention. The method begins at a step 402 where a chemical vapor deposition (CVD) reaction chamber is provided. By way of example, the reaction chamber may be as described in FIG. 3 above. From step 402, the method proceeds to a step 404 where sufficient heat to initiate the deposition process is applied to the reaction chamber. In one embodiment, the substrate may be heated to between about 20° C. and 500° C. and more preferably about 400° C. Once a proper substrate temperature is reached, the method will execute a step 406 where ultraviolet radiation is directed into the reaction chamber, such that the subsequently injected gaseous mixture will be exposed to the ultraviolet radiation. Once the substrate is heated to the appropriate deposition temperature, a gaseous mixture may be introduced into the reaction chamber. The gaseous mixtures are then fed into the reaction chamber in a step 408 through a suitable gaseous injector as described with reference to FIGS. 2 and 3.

In this embodiment, the preferred concentrations of the gaseous materials are as follows: (1) TEOS may be between about 0.1 percent and 0.5 percent by volume, and more preferably about 0.2 percent by volume; (2) ozone ($O_3$) may be between about 1 percent and 5 percent by volume, and more preferably 5 percent by volume; (3) oxygen ($O_2$) may be between about 30 percent and 40 percent by volume, and more preferably 35 percent by volume; (4) nitrogen ($N_2$) may be between about 60 percent and 70 percent by volume, and more preferably 60 percent by volume: (5) water ($H_2O$) may be between about 0.5 percent and 3 percent by volume, and preferably about 1.5 percent by volume; and (6) hydrogen peroxide ($H_2O_2$) may be between about 0 percent and 3 percent by volume, and preferably about 0.5 percent by volume.

Once a proper gaseous mixture is provided within the reaction chamber, the gaseous ozone may be decomposed into molecular oxygen and atomic oxygen. The method then proceeds to a step 410 where hydroxyl radicals are produced when atomic oxygen reacts with water. As a result, a rather large concentration of hydroxyl radicals may be produced. While the hydroxyl radicals are being generated, the method proceeds to a step 412 where TEOS molecules are being decomposed at an accelerated rate due to larger numbers of hydroxyl radicals present in the reaction chamber. Of course, it should be appreciated that the faster TEOS decomposes, the faster the rate of silicon dioxide film formation, and the larger percentage of TEOS actually used to form silicon dioxide.

While the silicon dioxide film is being deposited, the method proceeds to a step 414 where gaseous by-products and excess gases are simultaneously being removed from the CVD reactor to prevent film contamination. At this point, silicon dioxide film deposition ends, and the method may be repeated for any other wafers requiring TEOS film deposition.

Although the foregoing invention has been described in some detail for purposes of clarity of understanding, it will be apparent that certain changes and modifications may be practiced within the scope of the appended claims. By way of example, the hydroxyl mediated decomposition reactions of this invention may also be employed to accelerate the rate at which any of a number of organometallic compounds are reacted to produce deposition layers in chemical vapor deposition reactors. Such organometallic compounds may include, but are not limited to the deposition of BPTEOS, TEB, TMOP, OMCTS, HMDS, TMCTS, TRIES, etc. These organometallics (and others) may be employed to deposit thin films of tungsten (W), titanium (Ti), tantalum (Ta), silicides, for example. Therefore, the present embodiments are to be considered as illustrative and not restrictive, and the invention is not to be limited to the details given herein, but may be modified within the scope of the appended claims.

What is claimed is:

1. An apparatus for depositing a layer of material on a substrate, said layer of material being deposited from an organometallic compound which decomposes with the aid of hydroxyl radicals, said apparatus comprising:

a chemical vapor deposition reactor having a support for said substrate, and at least one inlet port;

a source of ozone gas coupled to said at least one inlet port;

a source of said organometallic compound coupled to said at least one inlet port; and a source of ultraviolet radiation oriented to direct ultraviolet radiation into the chemical vapor deposition reactor.

2. The apparatus for depositing a layer of material on a substrate as recited in claim 1, further comprising a heater for heating said substrate, wherein said chemical vapor deposition reactor is an atmospheric pressure chemical vapor deposition reactor chamber.

3. The apparatus for depositing a layer of material on a substrate as recited in claim 1, wherein said source of ozone gas includes an ozone generator which generates ozone molecules from oxygen molecules.

4. The apparatus for depositing a layer of material on a substrate as recited in claim 1, wherein said source of ultraviolet radiation is a mercury arc lamp.

5. The apparatus for depositing a layer of material on a substrate as recited in claim 1, further comprising a window transparent to ultraviolet radiation and orientated to allow passage of said ultraviolet radiation into said chemical vapor deposition reactor.

6. The apparatus for depositing a layer of material on a substrate as recited in claim 1, wherein the organometallic compound is selected from the group consisting of TEOS, BPTEOS TEB, TMOP, OMCTS, HMDS, TMCTS, and TRIES.

7. The apparatus for depositing a layer of material on a substrate as recited in claim 6, wherein the TEOS is introduced into the chemical vapor deposition reactor under conditions sufficient to produce a concentration of between about 0.1 percent and 0.5 percent TEOS by volume in the chemical vapor deposition reactor.

8. The apparatus for depositing a layer of material on a substrate as recited in claim 1, wherein the ozone is introduced into the chemical vapor deposition reactor under conditions producing a concentration of between about 1 percent and 5 percent ozone by volume in the chemical vapor deposition reactor.

9. The apparatus for depositing a layer of material on a substrate as recited in claim 1, further including a source of gaseous nitrogen coupled to said at least one inlet port.

10. A system for depositing a layer of material on a substrate, said layer of material being deposited from an organometallic compound which decomposes with the aid of hydroxyl radicals, said apparatus comprising:

a reactor means having a support means for said substrate, and at least one inlet means;

an ozone gas generating means coupled to said at least one inlet means;

a source of said organometallic compound coupled to said at least one inlet means; and an ultraviolet radiation generating means oriented to direct ultraviolet radiation into the reactor means.

11. The apparatus for depositing a layer of material on a substrate as recited in claim 10, further comprising a heating means for heating said substrate and wherein said reactor means is an atmospheric pressure chemical vapor deposition reactor chamber.

12. The apparatus for depositing a layer of material on a substrate as recited in claim 10, wherein said ozone gas generating means generates ozone molecules from oxygen molecules.

13. The apparatus for depositing a layer of material on a substrate as recited in claim 10, wherein said ultraviolet radiation generating means is a mercury arc lamp.

14. The apparatus for depositing a layer of material on a substrate as recited in claim 10, further comprising a window transparent to ultraviolet radiation and orientated to allow passage of said ultraviolet radiation into said chemical vapor deposition reactor.

15. The apparatus for depositing a layer of material on a substrate as recited in claim 10, wherein the ozone is introduced into the reactor means under conditions sufficient to produce a concentration of between about 1 percent and 5 percent ozone by volume in the reactor means.

16. The apparatus for depositing a layer of material on a substrate as recited in claim 10, further including a gaseous nitrogen generating means coupled to said at least one inlet means.

* * * * *